(12) United States Patent  (10) Patent No.: US 7,939,900 B2
Pei  (45) Date of Patent: May 10, 2011

(54) MATERIALS FOR THE FORMATION OF POLYMER JUNCTION DIODES

(75) Inventor: Qibing Pei, Temecula, CA (US)

(73) Assignee: The Regents of the University of California, Oakland, CA (US)

(*) Notice: Subject to any disclaimer, the term of this patent is extended or adjusted under 35 U.S.C. 154(b) by 302 days.

(21) Appl. No.: 12/041,884

(22) Filed: Mar. 4, 2008

(65) Prior Publication Data

US 2008/0224089 A1 Sep. 18, 2008

Related U.S. Application Data

(63) Continuation of application No. PCT/US2006/034969, filed on Sep. 7, 2006.

(60) Provisional application No. 60/715,393, filed on Sep. 7, 2005.

(51) Int. Cl.
*H01L 31/115* (2006.01)

(52) U.S. Cl. .......... 257/429; 257/40; 257/431; 257/439; 257/458; 257/656; 257/E29.336; 252/62.2; 313/498; 313/504; 313/506

(58) Field of Classification Search .................. 257/40, 257/82, 102, 103, 429, 431, 439, 458, 613, 257/656, E29.336; 252/62.2; 313/498, 504, 313/506
See application file for complete search history.

(56) References Cited

U.S. PATENT DOCUMENTS

| 4,724,053 | A | * | 2/1988 | Jasne | ............................ 106/236 |
| 5,682,043 | A | | 10/1997 | Pei et al. | |
| 5,965,281 | A | | 10/1999 | Cao | |
| 6,548,836 | B1 | | 4/2003 | Rubner et al. | |
| 7,169,483 | B2 | * | 1/2007 | Lewis et al. | ................... 428/690 |
| 2002/0037431 | A1 | | 3/2002 | Schoo et al. | |

OTHER PUBLICATIONS

Mitschke et al, "The electroluminescence of organic materials," The Royal Society of Chemistry, 2000, pp. 1471-1507.*
Leger, Janelle M. et al., "Self-Assembled, Chemically Fixed Homojunctions in Semiconducting Polymers", Advanced Materials, vol. 18, pp. 3130-3134, 2006.

* cited by examiner

*Primary Examiner* — Matthew C Landau
*Assistant Examiner* — Colleen E Snow
(74) *Attorney, Agent, or Firm* — John P. O'Banion

(57) ABSTRACT

Polymerizable anions and/or cations can be used as the ionically conductive species for the formation of a p-i-n junction in conjugated polymer thin films. After the junction is formed, the ions are polymerized in situ, and the junction is locked thereafter. The resulting polymer p-i-n junction diodes could have a high current rectification ratio. Electroluminescence with high quantum efficiency and low operating voltage may be produced from this locked junction. The diodes may also be used for photovoltaic energy conversion. In a photovoltaic cell, the built-in potential helps separate electron-hole pairs and increases the open-circuit voltage.

13 Claims, 4 Drawing Sheets

MATERIALS FOR THE FORMATION OF POLYMER JUNCTION DIODES

CROSS-REFERENCE TO RELATED APPLICATIONS

This application claims priority from, and is a 35 U.S.C. §111(a) continuation of, co-pending PCT international application serial number PCT/US2006/034969, filed on Sep. 7, 2006, incorporated herein by reference in its entirety, which claims priority from U.S. provisional application Ser. No. 60/715,393, filed on Sep. 7, 2005, incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to conjugated polymer thin film technology, and more particularly, to the use of polymerizable species as the ionically conductive species for the formation of p-i-n junctions in conjugated polymer thin films.

2. Description of Related Art

In the past 10 years or so, there has been a flurry of research on the use of neutral, undoped conjugated polymers as new semiconductor materials. Polymer light emitting diodes have indeed evolved into one of the most promising flat panel display technologies. Conjugated polymers are also explored for other semiconductor devices such as thin film transistors, solar cells, photodetectors, and so on. Due to limited carrier mobilities that are typically 2 to 4 orders of magnitude lower than single crystal silicon, polymer semiconductors in the foreseeable future will not replace silicon in high-speed devices but may find applications for which large area, light weight and flexibility are important.

Semiconductor devices made from silicon and other inorganic compounds are typically based on p-n or p-i-n junctions, formed by doping with hetero-atoms. In this context, the term "doping" is defined as when the polymers are oxidized (p-doped) or reduced (n-doped). The charges introduced onto the polymer chains are compensated by anions or cations (the dopants). Note that doping is sometimes used in the literature for simple admixing of a compound(s) into a polymer matrix.

Unlike silicon devices, conjugated polymers have been used in their undoped form in semiconductor devices, for several reasons. First, neutral conjugated polymers can be rendered soluble by the introduction of long alkyl side chains. These soluble polymers, however, become insoluble as soon as they are doped to have a high conductivity. Although there are techniques to disperse doped conducting polymers in water or organic solvents, high content of dispersion-enhancing agents are used. The dopants and the dispersing agents are mobile and therefore not suitable for the formation of stable p-n or p-i-n junctions. Secondly, it is difficult to carry out in-situ doping of conjugated polymer thin films in a controllable fashion (both doping depth and density). Even if such doping can be done, the dopants introduced in-situ are mobile. Finally, n-type doped conjugated polymers are usually unstable and susceptible to degradation by oxygen and water. Formation of p-n or p-i-n junctions in conjugated polymers has, therefore, been difficult to achieve. Without such junctions, the low mobilities of polymers, generally on the order of $10^{-1}$ $cm^2V^{-1}s^{-1}$ or lower, become more problematic. Charge carriers may not be able to reach the charge-collection electrodes or charge recombination centers before they are trapped.

The in-situ formation of a dynamic p-i-n junction in conjugated polymers composited with a solid electrolyte has been demonstrated (U.S. Pat. No. 5,682,043 (1997), assigned to Uniax Corporation). The junctions were initially considered as p-n junctions, but were also treated as p-i-n junctions to reflect the significance of the neutral undoped region between the p- and n-doped regions. There has been no evidence to favor one over the other. It is likely that the junctions could be either p-n or p-i-n, depending on the polymer composition and device driving condition.

In the so-called polymer light emitting electrochemical cells (LECs) schematically shown in FIG. 1, a dynamic p-i-n junction is created when a voltage equal to or greater than the bandgap potential of the conjugated polymers is applied on thin films of the polymer composites. Under the external electric field, the anions of the electrolyte drift to the anodic side where the conjugated polymers are p-doped, while cations travel to the cathodic side to n-dope the polymers. An ionically conductive polymer such as polyethylene oxide can be admixed to enhance the ionic mobility. This p-i-n junction in the LECs is dynamic—as soon as the bias voltage is removed, the p- and n-doped regions will deplete each other while the oppositely charged dopants migrate together to recombine. The processes in FIGS. 2A and 2B are reversible. Under a constant bias voltage, the junction can be quite stable, as indicated by the relatively long lifetime of certain LECs, up to a few thousand hours. The n-doped polymers are generally unstable in air. The two electrodes, which function as oxygen and moisture barriers, may help prolong the lifetime of the LECs.

The dynamic p-i-n junction has several desirable benefits. First, the polymer/electrode interfaces are turned into ohmic contact due to the high conductivity of the doped regions. Therefore, there is no need to match the work function of the cathode to the polymer's LUMO and the anode to HOMO. Stable metals can be used as the electrodes. Next, one may ignore the low mobility of the polymers and use fairly thick polymer films in sandwich-structured devices. When the films are thick, the i region in the junction is only a small fraction of the whole film. This is reflected in FIGS. 3 and 4, in which the i region is about one tenth of the entire film. The majority of the film is in a doped region and is highly conductive. Finally, the built-in potential of the p-i-n junction can be close to the bandgap potential of the conjugated polymers, i.e., 1 to 3 V, depending on the chemical structure of the polymers. This built-in potential can provide a large open-circuit voltage for photovoltaic applications.

On the other hand, the dynamic p-i-n junction also has undesirable features. The formation of the p-i-n junction relies on the redistribution of dopants, which takes time. The turn-on time for the LECs varies from 0.1 second up to a few hours. An external bias is required to sustain the junction. Therefore, this dynamic junction is not useful for transistors and photovoltaic devices. Another problem is that any degradation in the doped regions will cause shifting of the p-i-n junction. It has been observed that in some LECs, the junction slowly shifts toward the cathode and eventually touches one of the contact electrodes.

It has been reported that the p-i-n junction in an LEC could be stabilized by cooling the device well below the glass transition temperature of the ion-transport polymer. The LECs with frozen p-i-n junctions exhibit characteristic behaviors of light emitting diodes (LED), including diode rectification, uni-polar light emission at the same polarity as that used for generating the junction, and fast response. In addition, as the ion motion is frozen, the polymer LECs could be driven at bias voltages beyond the electrochemical stability window. A similar frozen junction was also obtained at room temperature using crown ethers as the ion transport medium whose glass transition temperature is above room temperature. The resulting LECs exhibit high electroluminescence efficiency and brightness. However, frozen junctions still have shortcomings, such as a low rectification ratio and slow drifting of dopants.

BRIEF SUMMARY OF THE INVENTION

The present invention involves the use of polymerizable anions and/or cations as the ionically conductive species for the formation of a p-i-n junction in conjugated polymer thin films. After the junction is formed, the ions are polymerized in situ, and the junction is locked thereafter. The resulting polymer p-i-n junction diodes could have a high current rectification ratio. Electroluminescence with high quantum efficiency and low operating voltage may be produced from this locked junction. The diodes may also be used for photovoltaic energy conversion. In a photovoltaic cell, the built-in potential helps separate electron-hole pairs and increases the open-circuit voltage.

One object of the invention is processable polyelectrolytes containing polymerizable charge-compensating anions or cations. The polyelectrolyte can be conjugated polyelectrolyte in which the polymer chain contains both conjugated chain and ionic moieties.

Another object of the invention is the fabrication of polymer p-i-n junction diodes using processable conjugated polyelectrolyte containing polymerizable ions, or using ionic liquid monomers at least one of the ions of the molecule is polymerizable.

An aspect of the invention is a static p-i-n junction, comprising a polymer composite; wherein the polymer composite further comprises mobile anions or cations; wherein the mobile anions or cations are immobilized on command; and wherein the immobilized anions or cations are locked in position after being immobilized.

In one embodiment of this aspect, the polymer composite comprises a solid electrolyte that is photochemically curable. In other embodiments, wherein the immobilization is thermally induced or the immobilization is induced due to internal current flow.

A further aspect of the invention is a static p-i-n junction, comprising a substrate; an indium-tin-oxide layer on the substrate; a polymer thin film layer on the indium-tin-oxide layer; a top electrode layer deposited on the polymer thin film layer; wherein the polymer thin film layer comprises a polymer composite; wherein the polymer composite comprises a conjugated polymer; and wherein the polymer composite comprises mobile polymerizable ions.

In other embodiments of this aspect, the polymerizable ions are part of an ionic liquid monomer, the polymerizable ions are immobilized near a contact electrode, or the polymerizable ions are photocurable. An another embodiment, the polymer thin film layer further comprises a photosensitive material that absorbs wavelengths in the visible spectrum. In still another embodiment, the photosensitive material has an absorption spectrum that overlaps an electroluminescence spectrum of the conjugated polymer, whereby the p-i-n junction emits electroluminescent light and induces curing and immobilization of the polymerizable ions.

A still further aspect of the invention is a p-i-n junction, comprising a polyelectrolyte comprising polymerizable charge-compensating anions or cations. In an embodiment of this aspect, the polyelectrolyte further comprises a polymer chain comprising conjugated chain and ionic moieties. In another embodiment, the anions or cations are immobilized; and the immobilization is not subject to reversal.

Yet another aspect of the invention is a conjugated polyelectrolyte, comprising a plurality of polymerizable charge-compensating anions or cations. An embodiment of this aspect further comprises a polymer chain comprising conjugated chain and ionic moieties.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Figure 1:
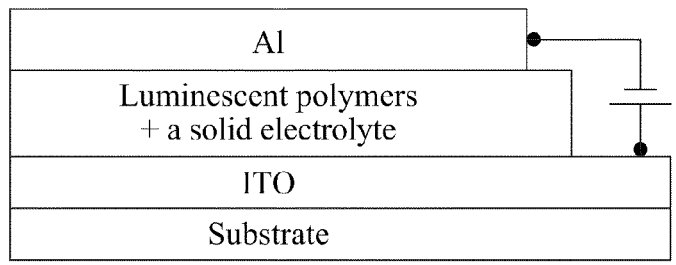
FIG. 1 is a cross section of the thin film structure of a light emitting cell with a dynamic p-i-n junction, in which the polymer layer comprises a conjugated polymer and a solid electrolyte.
Figure 2A:
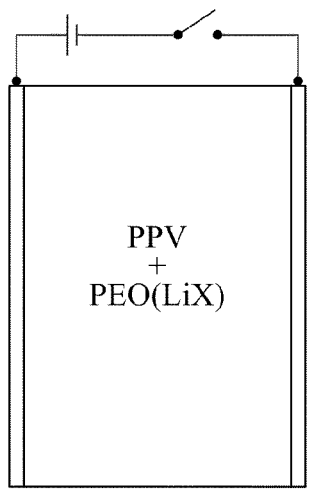
FIG. 2A shows the uniform blend in the polymer layer when no external bias is applied.
Figure 2B:
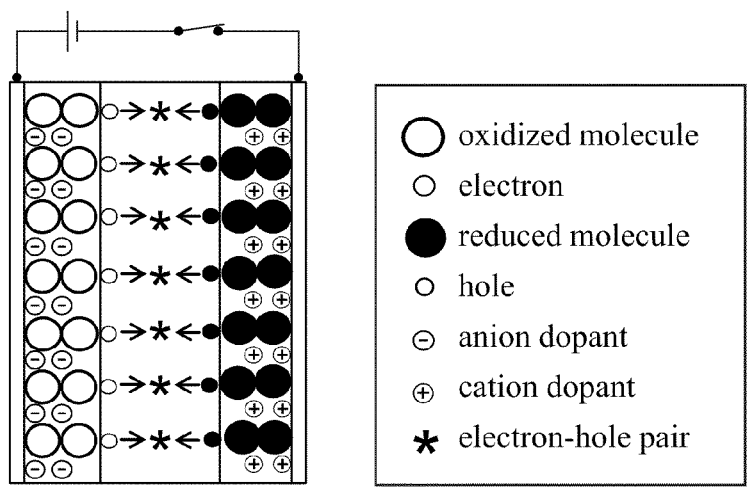
FIG. 2B shows the presence of symmetric p-doping at the anode and n-doping at the cathode when the external bias is greater than the band gap of the conjugated polymer in the polymer layer.

Referring more specifically to the drawings, for illustrative purposes the present invention is generally embodied in FIG. 1 through FIG. 6. It will be appreciated that the invention may vary as to configuration and as to details of the parts, and that the method may vary as to the specific steps and sequence, without departing from the basic concepts as disclosed herein.

The present invention involves solid electrolytes that are polymerizable and compatible with appropriate conjugated polymers, conjugated polymers that are stable at both the p- and n-doped states, and processing of a static p-i-n junction in polymer thin films.

1. Synthesis of Polymrizable Electrolytes

The LECs have been fabricated from dual-ion or single ion conductors. To form a stable p-i-n junction in the LECs, either the anions or the cations of the solid electrolyte need to be mobile yet they can be immobilized on demand. One example of such ionic species is the photochemically curable cation choline-acrylate, shown as Compound 1. This compound may be synthesized from choline and acryloyl chloride. The counteranion ($A^-$) may be polymeric, e.g., polystyrene-sulfonate, such that the anion can be anchored on the polymer chain whereas the cation is mobile. The cation may be immobilized by initiating a photo-initiated polymerization of the acrylate moiety in the presence of a suitable photosensitizor. Thermally induced polymerization is also feasible.

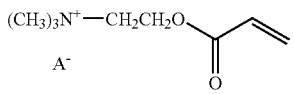

Compound 1. Choline-acrylate synthesized from choline and acryloyl chloride. The counteranion ($A^-$) can be selected from such anions as chloride, tetrafluoroborate, triflate, polystyrenesulfonate, and conjugated polymers containing sulfonate side groups.

A conjugated polymer that functions as the electronic medium for electron and hole transportation and for doping may also be modified to contain anionic pendant groups. Polythiophene, poly(1,4-phenylene vinylene), and poly(fluorene) containing sulfonate anion side groups have been reported. Through metathesis, the countercations may be replaced with choline-acrylate for the formation of static p-i-n junctions.

The alternative approach is also possible via curable anions. For instance, 4-acrylylphenylsulfonate, shown as Compound 2, can be readily synthesized from 4-hydroxybenzenesulfonic acid. The countercation ($M^+$) can be a quaternary amine anchored to a conjugated polymer chain such as poly(fluorenes).

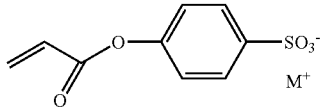

Compound 2. 4-acrylylphenylsulfonate synthesized from 4-hydroxybenzenesulfonic acid and acryloyl chloride. The countercation ($M^+$) can be selected from a wide range of small cations and polymeric cations such as conjugated polymers containing quaternary amine side groups.

The ionic conductivity of these curable electrolytes is probably limited. Fortunately, the resulting slow formation of the p-i-n junction in polymer thin films is only during the material or device preparation process. It does not affect the functions of the fabricated devices, and is therefore only a minor concern. In addition, there are ways to improve the ionic conductivity of the solid electrolytes by introducing ion-conductive channels in the polymer composites. These channels can contain these additives: (1) a polar liquid such as propylene carbonate, (2) a surfactant such as octylcyanoacetate, or (3) a polymer with high polarity and low glass transition temperature, such as poly(ethylene oxide).

2. Synthesis of Dually Dopable Conjugated Polymers

For the formation of stable p-i-n junctions, the polymers have to be both p-type and n-type dopable. Most conjugated polymers more readily p-doped, and the p-doped state is more stable compared to the n-doped state. Some polymers have conjugation structures that are electron deficient and are n-dopable. Polythiophenes with crown ether side groups also showed stable n-doping due to the strong binding of cation dopants in the crown ethers. Thiophene oligomers with fluorocarbon side groups exhibit fairly high n-type mobilities. Previous studies on the use of conjugated polymers for electrochemical energy storage have already resulted in conjugated polymers that can be repeatedly p- and n-doped, including poly(1,2-dithienyl-2-cyanoethylene) and poly-3(3,4,5-trifluorophenyl)thiophene. The unique dopability of these polymers can be exploited and the polymer structures modified to introduce moieties that can anchor anions or cations or can accommodate electrolytes. One approach is to introduce the polar moieties by copolymerization, as exemplified by the two copolymers shown as Compounds 3A and 3B.

It is interesting to study whether block copolymers exhibit better performance than random copolymers. Diblock copolymers made up of a p-dopable block and an n-dopable block may be dually dopable, such that in a static p-i-n junction, the p-block is p-doped in the p-region and the n-block is n-doped in the n-region. The block copolymer in the i region could serve as the photosensitive part that converts photons into electrons and holes. Another scheme of diblock copolymer consists of a block of electronic conductor (conjugated polymer) and a block of ionic conductor, e.g., polyether. By controlling relative length of the two blocks, systematic control of the domain size of regions of electronic and ionic conductors may be achieved.

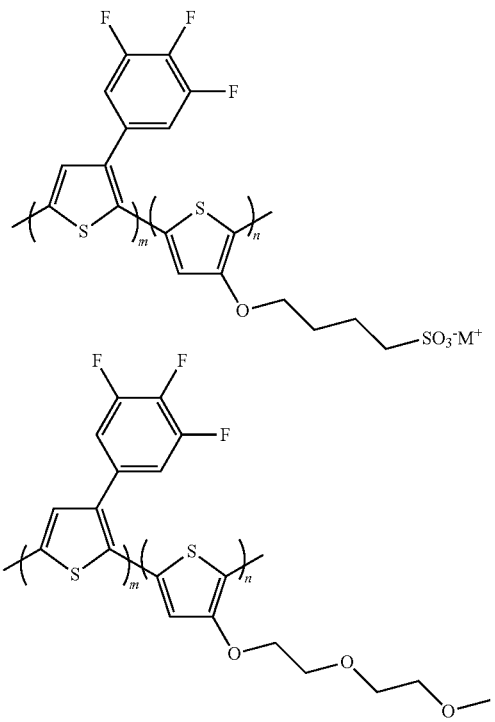

Compounds 3A, 3B. p- and n-dually dopable conjugated copolymers that are anionic polyelectrolyte (left) or contain polyethers that can conduct ions (right). The cation $M^+$ could be replaced, by metathesis, with photocurable choline-acrylate, shown as Compound 1.

An alternative approach is to use composites of p-dopable and n-dopable conjugated polymers. For the p-type component of the composites, regioregular poly(3-alkylthiophene) is a good option. Regioregular polythiophenes with polyelectrolyte or polyether side groups, shown as Compounds 4A, 4B, and 4C, can be synthesized.

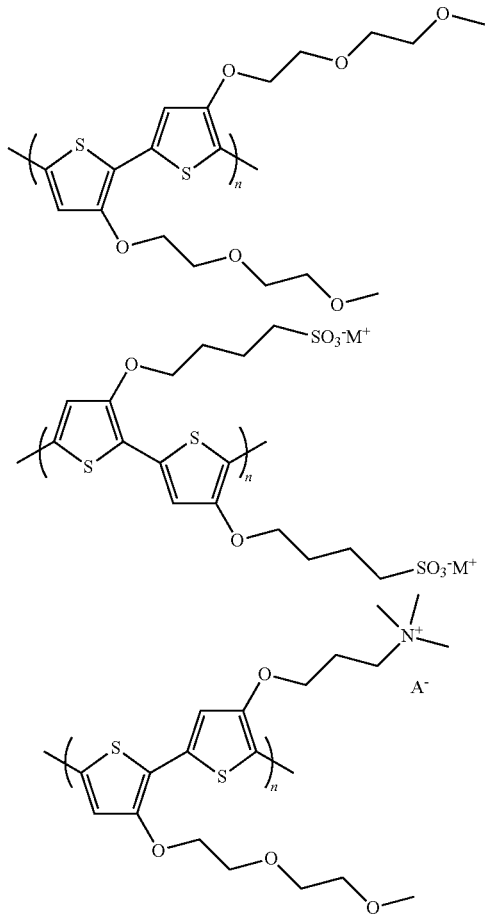

Compounds 4A, 4B, and 4C. p-dopable conjugated copolymers that contain polyethers (left), are anionic polyelectrolyte (center) and cationic polyelectrolyte (right). The counterions, $M^+$ and $A^-$, can be replaced with the photocurable ions shown compounds 1 and 2.

For the n-type component of the composites, we consider copolymers containing regioregular poly-3(3,4,5-trifluorophenyl)thiophene, cyano-PPV, or copolymers of quinoxaline and thiophene. The chemical structures of the latter two polymers are shown as Compounds 5A and 5B. We have used poly(2,3-di(p-tolyl)-quinoxaline-5,8-diyl) in p- and n-mixed polymer LEC devices.

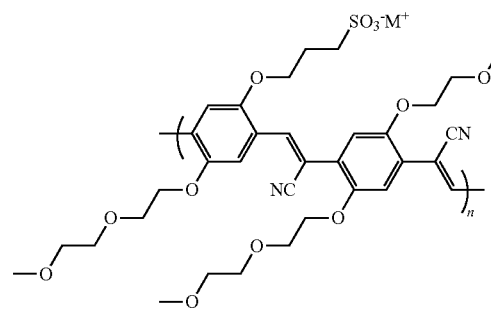

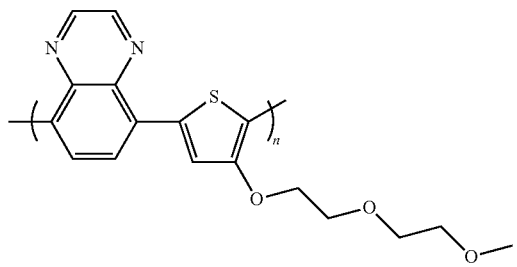

Compounds 5A and 5B. n-dopable conjugated copolymers that are anionic polyelectrolyte (left) or contain polyethers that can conduct ions (right).

Compounds such as the polyelectrolyte shown as Compound 6 can also be synthesized.

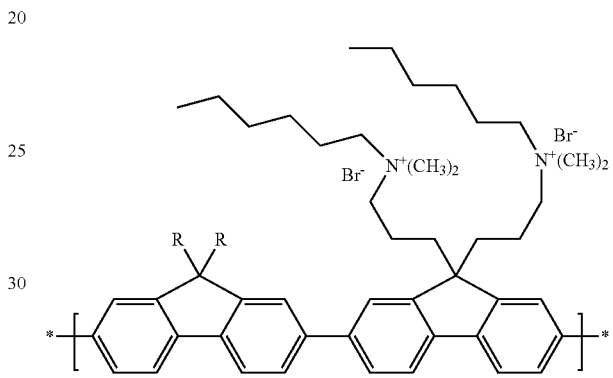

Compound 6.

The $Br^-$ anion was replaced with 3-sulfopropyl acrylate anion by metathesis. The anion exchange was carried out by placing the polymer solution in DMF in a dialysis membrane bag. The bag was then placed in an aqueous solution of 3-sulfopropyl acrylate potassium salt. After one to two days of ion exchange, the bag was then placed in a DI water to remove extra salt. The resulting polymer is shown as Compound 7.

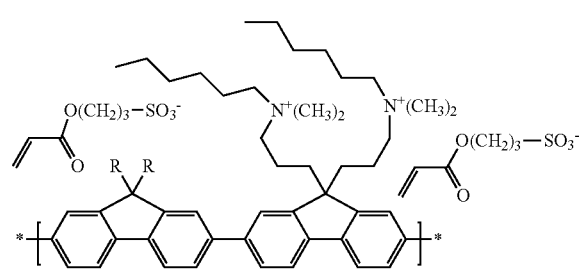

Compound 7. This polymer is soluble in solvent such as N,N-dimethylformamide and dimethyl sulfoxide. Thin films spin-coated from the solution can be photochemically crosslinked, after which the polymer become insoluble. The crosslinking is resulted from the polymerization of the anions.

Other suitable structures for the polyelectrolytes are those shown as Compounds 8A, 8B, and 8C.

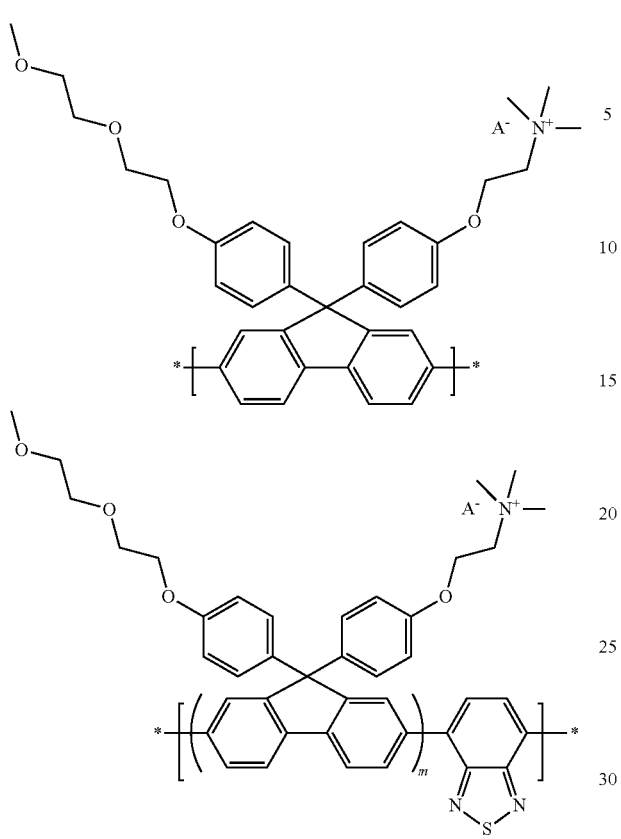

Compounds 8A and 8B.

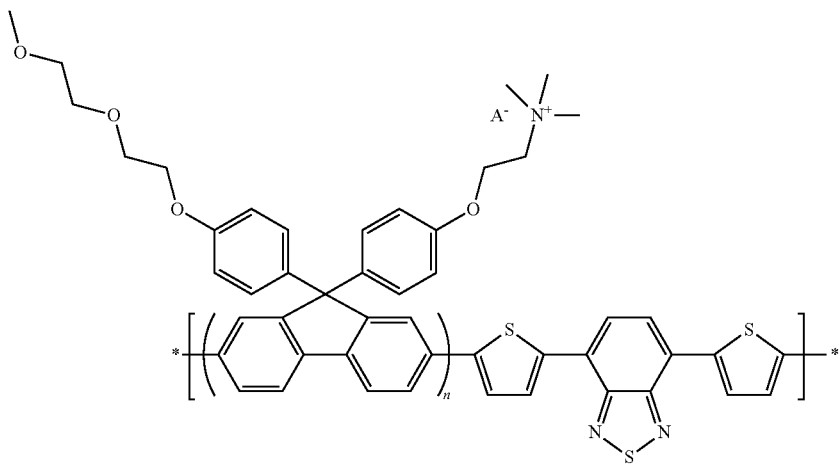

Compound 8C.

In one alternative approach, an electrolyte with the following structure may be used together with a conjugated polymer.

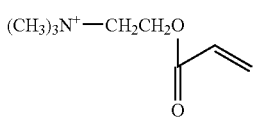

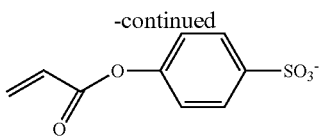

Both the anion and cation are mobile, and may redistribute with the corresponding formation of a p-i-n junction. Upon junction formation, both the anion and cation can be photochemically polymerized and therefore immobilized. In this composition, one may add acrylate dimmers such hexanediol diacrylate that facilitates the immobilization of the ionic species.

3. Processing of Static p-i-n Junction in Polymer Thin Films

Figure 3:
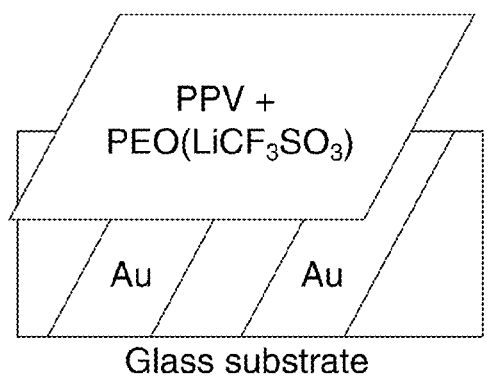
FIG. 3 is a dynamic light-emitting p-i-n junction in a surface cell configuration, showing a schematic drawing of a polymer thin film coated onto parallel gold electrodes spaced by 15 μm.
Figure 4:
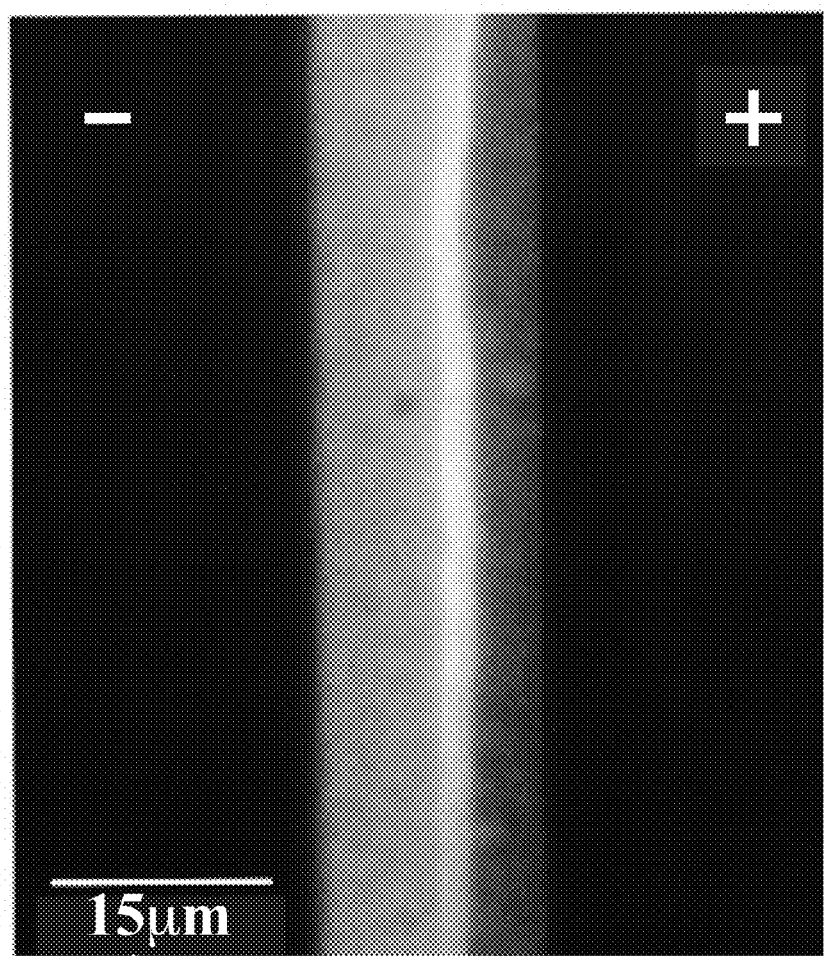
FIG. 4 is an optical microphotograph of the surface cell at 4 V bias, showing the emission of green light from the narrow dynamic junction near the center of the spacing.

The formation and behaviors of a static p-i-n junction in polymer thin films were extensively studied. For direct observation and measurements, parallel electrodes on the surface were used initially to form surface p-i-n junctions as shown in FIG. 3. Because of the high conductivity of doped conjugated polymers, dynamic p-i-n junctions can form between electrodes separated by as far as 1 cm. The light emitting junction can hence be observed under an optical microscope, a convenient tool to directly investigate the formation, evolution/decay, stabilization of the junctions. FIG. 4 shows an optical microphotograph of a surface junction formed between electrodes separated by 15 μm. With the surface configuration, one can conduct a number of in-situ modifications on the materials and the junction. For example, adding organic solvents such as propylene carbonate may speed up the junction formation under bias and junction relaxation when the bias is removed. The surface p-i-n junction provides a platform to study doping and junction profile resulting from additives that may interact with polymers in the p, i, and n regions of the junction. For instance, electron acceptors and donors, which interact with the n- and p-regions, respectively, could shift the location of the junction. Chromophores that undergo energy transfer from or to the polymers could modify the absorption or emission spectra of the polymers. Other chemicals interacting with the junction may be detected.

The surface cell configuration also simplifies the photocuring of the dopants. Because of the slow formation of the dynamic p-i-n junction, the photocuring can be conducted at various stages of the junction formation process. This allows the study of the doping profile and the progression of the junction formation. Current rectification ratio at forward and reverse biases, junction width, junction potential, optical absorption, photocurrent generation, and electron-hole recombination can be measured on the junction at various stages of its formation process.

Figure 5A:
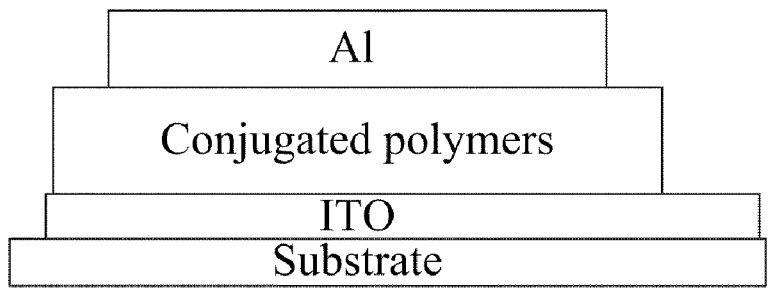
FIG. 5A is a cross section of a thin-film sandwich structure.
Figure 5B:
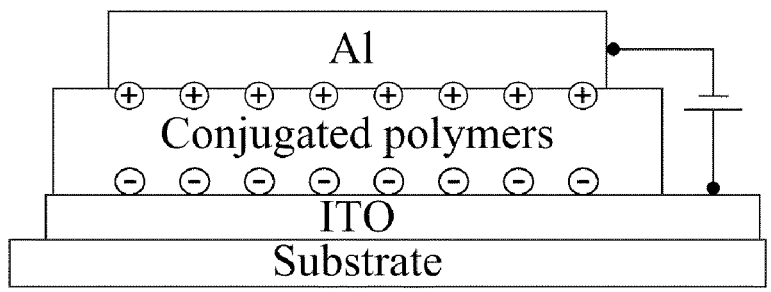
FIG. 5B shows the formation of a p-i-n junction at 2-3 V in the structure of FIG. 5A.
Figure 5C:
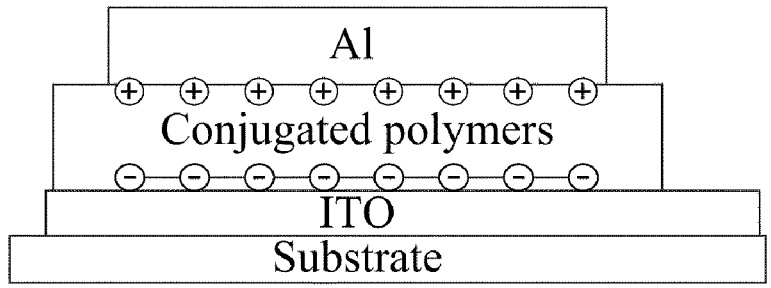
FIG. 5C shows the immobilization of the photocurable dopants in FIG. 5B to form a static p-i-n junction.

The i region of the p-i-n junction in the surface cells is a thin line. In a polymer thin film sandwiched between two contact electrodes, the i region would be a thin layer. FIG. 5A illustrates the fabrication process of a sandwiched p-i-n junction. A polymer thin Film is spin-coated onto ITO/substrate, followed by deposition of the top electrode, which can be either a metal such as aluminum or semitransparent conducting polymers, such as poly(3,4-ethylenedioxythiophene) (PEDOT). The advantages of using PEDOT include (1) the devices are semitransparent, allowing for direct optical observation, and (2) the compositions of the polymer films may be analyzed by Auger electron spectroscopy in combination with depth profiling.

Conjugated polymers described in Section 2 were initially used in the polymer thin films. Dually dopable polymers shown as Compounds 3A and 3B were admixed, in various combinations, with the photocurable ions shown as Compounds 1 and 2. In the composite, only photocurable ions are mobile. The counterions are anchored either on the conjugated polymer or on a polyelectrolyte. Furthermore, composites of p- and n-dopable polymers shown as Compounds 4A-4C and 5A-5B were prepared, along with suitable photocurable ions. To enhance the ionic conductivity, compounds such as polyethylene oxide or a small amount of propylene carbonate may be mixed into polymer films. Ionic conductivity was studied by impedance spectroscopy. The n-type polymers may be replaced with inorganic nanoparticles or rods made of $TiO_2$ or CdSe. Morphology of the polymer composites was studied with respect to varying solvent, spin-coating conditions, substrate treatment, and post-coating annealing. According to the findings, new polymers and photocurable ions may be synthesized, and they may afford composites with desirable morphology for the formation of p-i-n junctions.

The photocurable ions in the polymer films must be mobile and be able to photochemically polymerize. To induce photocuring, the excitation light needs to transmit through the layer(s) from the substrate side. A thin layer of indium-tin-oxide (ITO) and quartz or plastic substrate will allow the transmission of long-wavelength ultraviolet light to which many photosensitizers respond. Alternatively, a photosensitizer that absorbs in the visible spectrum may be admixed in the polymer layer. In addition, if the absorption spectrum of the photosensitizer and the electroluminescence spectrum of the conjugated polymer overlap, the photocuring may be initiated internally and automatically—when the p-i-n junction is formed, electroluminescent light is emitted from the junction and induces the curing and immobilization of the dopants. This unique capability brings about a few desirable features:

(1) the p-i-n junction is stabilized as it is formed, avoiding degradation due to mobile dopants; and (2) non-transparent metals or conducting polymers may be used as the electrodes.

This approach works only for electroluminescent polymers. Conjugated polymers with small band gaps, $E_g$<2.1 eV, may not be electroluminescent. For these polymers, the p-i-n junction has to be stabilized by external light or heat. Polymerization of acrylates may be initiated by thermally responsive initiators such as benzoyl peroxide. Temperature changes may also modify the p-i-n junction.

4. Characterization of Polymers and Ionic Dopants in Static p-i-n Junctions

A direct approach for studying the composition of a static p-i-n junction is Secondary Ion Mass Spectrometry (SIMS). The dopants shown as Compounds 1 and 2 contain N or S atoms which are not present in the polymer. Their concentrations are directly related to the extent of doping. In addition, the presence of dopants also changes the molar ratio of C, H, and O. Depth profiling of polymer layer by dynamic time-of-flight SIMS (TOF-SIMS) helps to infer the doping concentrations in the various regions of the junction. Applied Microanalysis Labs, Inc., located in Santa Clara, Calif., provides TOF-SIMS service.

UV-visible absorption spectroscopy is another useful tool to study the doping profiles. The absorption spectra of the neutral, p-doped, and n-doped polymers can be measured individually. The absorption spectrum of the polymer layer in the junction would be contributed from the neutral and doped polymers. The relative peak intensities are used to estimate the thickness of the doped regions. Furthermore, certain conjugated polymers exhibit distinct polaron and bipolaron absorption spectra at lightly and heavily p-doped states, respectively. Spectra of the n-doped polymers are less studied, partly because of the materials' instability in air. In the junction diodes, the n-doped region is encapsulated and may be extensively studied.

Photoluminescence spectroscopy is also a valuable method. Most conjugated polymers with a band gap above 2 eV are photoluminescent at the neutral state. The emission is highly Stokes shifted from the absorption. Doping effectively quenches fluorescence. Therefore, studying the photoluminescent behavior may further our understanding of the state of materials in the polymer p-i-n junction.

5. Characterization of Polymer p-i-n Junctions

The most direct and convenient approach to characterizing p-i-n junctions in polymer films is through various microscopic techniques. The widths of the p, i, and n regions formed in a surface configuration can be observed under an optical microscope. For a finer resolution, scanning electron microscopy (SEM) allows us to study the morphology of the polymer films both on surface and at the cross section. The doped regions are much more conductive than the neutral region. Therefore, the SEM can gain certain contrast to distinguish the doped and neutral regions. Another useful tool is the SIMS as described in Section 4. Dynamic TOF-SIMS can be used to investigate the chemical compositions in the three regions. The charts of the atomic concentrations of the key elements versus depth will reveal the profile of the junction.

The built-in potential of a static p-i-n junction was studied by three techniques: (1) current-voltage response at both forward and reverse biases. The turn-on voltage corresponds to the junction potential which, in the ideal scenario, equals to the bandgap of the conjugated polymer divided by electron charge ($E_g/e$) (see FIG. 6); (2) photocurrent measurement during scanning of the excitation wavelength.

6. Study of the Photovoltaic Property of the p-i-n Junctions

The polymer p-i-n junction diodes promise a number of important applications. They may materialize the perceived characteristics of polymer semiconductor devices: flexibility, light weight, large-area thin film, low cost, and environmental benignancy. First, the junctions are useful for electroluminescence with high quantum and power efficiencies. They retain the advantages exhibited by the LEC devices but overcome problems such as instability due to mobile dopants and slow turn-on speed. For this application, the conjugated polymers must be highly luminescent. Conjugated polymers currently used in polymer LEDs can be used for this application after modifying the side groups to allow dopant immobilization. Secondly, the built-in junctions increase the photocurrent and therefore the photodetection sensitivity. Thirdly, the p-i-n junctions can carry much higher current than neutral conjugated polymers. This feature is important in fabricating polymer thin-film transistors.

Figure 6:
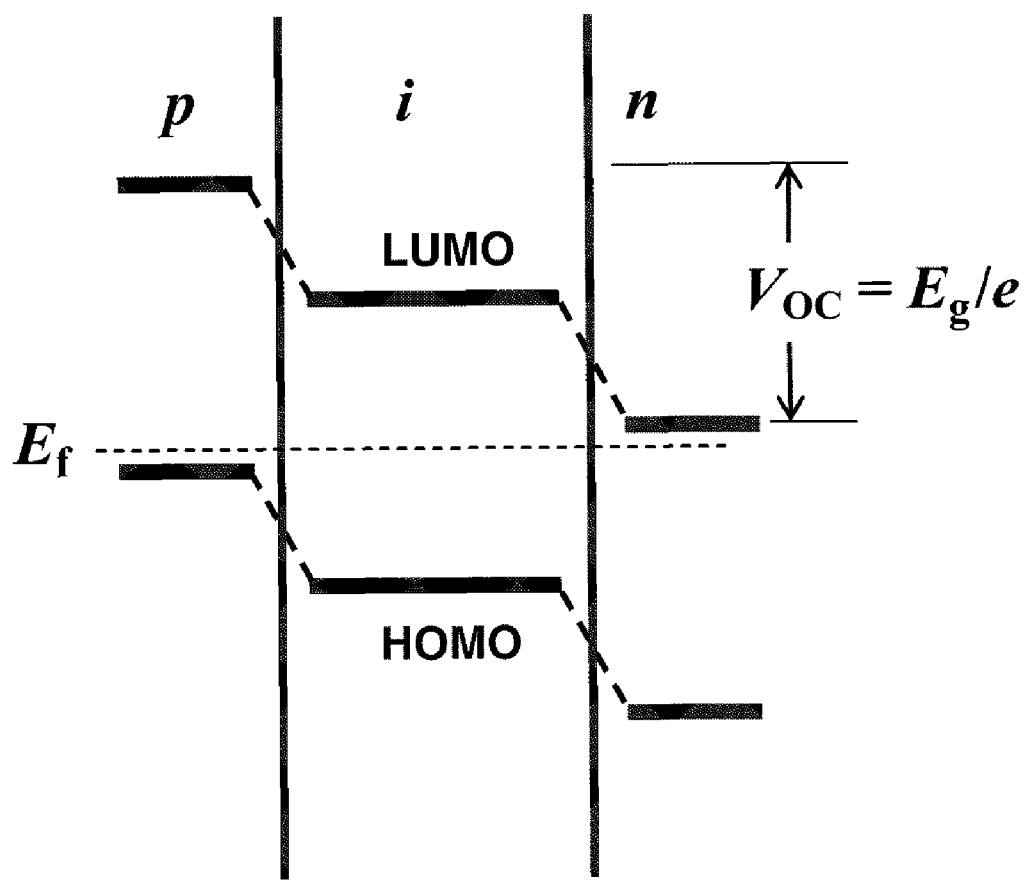
FIG. 6 is a proposed potential diagram of a polymer p-i-n junction.

Regarding the photovoltaic behavior of the junction, FIG. 6 schematically shows the proposed potential diagram of the p-i-n junction. The open circuit voltage varies depending on the built-in potential of the junction. It may be tuned by either modifying the doping concentration at n- and p-regions or using polymers with different bandgaps. This voltage is independent of the work-function of the electrode material. It is much higher than the values reported for organic solar cells using neutral conjugated polymers or small molecules. The high junction potential also facilitates the separation of the photogenerated electron-hole pairs and therefore increases the photocurrent. The photocurrent is determined, in part, by the thickness of the i region in the junction. The optical absorption coefficient of conjugated polymers is typically in the range of $0.5$-$1.0 \times 10^{-5}$/cm. For an i region with an absorption coefficient of $1.0 \times 10^{-5}$/cm, 90% of the incident light will be absorbed if it is 100 nm thick. The photocurrents in polymer solar cells can be improved by a number of techniques, such as using blends of p- and n-doped polymers to form bulk hetero-junctions in the i region, using inorganic nanorods such as CdSe to replace the n-type polymers, or the presence of ionic species in the i region.

7. Applications

Compared to conventional semiconductor devices, polymer semiconductor devices are particularly attractive for applications in which flexibility, light weight, large-area thin film, low cost, and environmental benignancy are important aspects. Many of these characteristics have not been manifested in commercial products, largely due to the use of neutral conjugated polymers which have certain limitations, including low carrier mobility and high charge injection barrier at the polymer/electrode interfaces. The polymer p-i-n junction diodes disclosed in this application may overcome these limitations and materialize much of the perceived characteristics for polymer semiconductor devices. The polymer diodes are attractive for a number of important applications including (1) electroluminescence with high quantum and power efficiencies; (2) photodetection at high sensitivity; (3) solar energy conversion at high efficiency; and (4) large area thin film transistors capable of carrying high current density.

The mobility of conjugated polymers is unlikely to match that of single crystal silicon, even after substantial improvements are made. However, polymer p-i-n junction diodes offer several advantages, particularly for the application in solar energy harvesting:

(A) Their optical and electrical properties can be conveniently manipulated through a variety of techniques including structural modification and polymer blending. For instance, polymers and blends with a broad range of bandgaps may be obtained for coverage of the whole solar spectrum.

(B) Their production is reproducible, scalable and low-cost. Polymer synthesis can be performed under mild conditions, e.g., at room temperature, which makes it convenient to integrate into practical devices. Using conventional and specially-developed polymer processing techniques, large-area devices may be fabricated at low cost.

(C) The polymer solar cells are thin and flexible. They are lightweight and shock resistant, and they greatly reduce installation cost.

(D) They can be stacked, either before or after each p-i-n junction layer is encapsulated, to enhance the energy conversion efficiency, similar to multi-junction solar cells.

(E) The polymer solar cells can be made disposable, therefore compensating for their limited operation lifetime.

(F) They can be made conformable, or even woven into fabrics.

This research also benefits the ongoing commercial development of organic light emitting diode (OLED) displays.

8. Conclusion

This research provides an alternative materials solution to several important application fields. The new curable ions may find applications beyond organic electronics, in areas such as surfactants, surface treatment, and plastic modifiers. The new conjugated polymers, with their regioregular structure and polar or ionic side groups that facilitate molecular assembly and orientation, may lead to new materials with higher carrier mobility. They may broaden the scopes of fundamental science and application for conjugated polymers. The investigation of polymers that are both ionically and electronically conductive may uncover new phenomena and science. The proposed polymer p-i-n junction diodes should provide the foundation for a new generation of organic electronic devices rivaling the omnipresent inorganic semiconductor devices in certain aspects of device performances, in addition to advantages of mechanical flexibility and large-area fabrication at low cost. The research lends itself to interdisciplinary research involving synthesis of p- and n-type conjugated polymers, doping and processability of such polymers, fabrication of semiconductor devices, characterization of polymer materials, and fabrication of solid state devices.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A static p-i-n junction, comprising:
 a polymer composite of a solid photochemically curable electrolyte;
 wherein said polymer composite further comprises mobile anions or cations;
 wherein said mobile anions or cations are immobilized on command; and
 wherein said immobilized anions or cations are locked in position after being immobilized.

2. A junction as recited in claim 1:
 wherein said immobilization is thermally induced.

3. A junction as recited in claim 1:
 wherein said immobilization is induced due to internal current flow.

4. A static p-i-n junction, comprising:
 a substrate;
 a layer of conductive material on said substrate;
 a polymer thin film layer on said layer of conductive material;
 a top electrode layer deposited on said polymer thin film layer;
 wherein said polymer thin film layer comprises a polymer composite;
 wherein said polymer composite comprises a conjugated polymer; and
 wherein said polymer composite comprises photocurable mobile polymerizable ions.

5. A junction as recited in claim 4:
 wherein said polymerizable ions are part of an ionic liquid monomer.

6. A junction as recited in claim 4:
wherein said polymerizable ions are immobilized near a contact electrode.

7. A junction as recited in claim 4, wherein said polymer thin film layer further comprises:
a photosensitive material that absorbs wavelengths in the visible spectrum.

8. A junction as recited in claim 7:
wherein said photosensitive material has an absorption spectrum that overlaps an electroluminescence spectrum of said conjugated polymer;
whereby the p-i-n junction emits electroluminescent light and induces curing and immobilization of said polymerizable ions.

9. A junction as cited in claim 4:
wherein said conductive material is transparent.

10. A junction as cited in claim 4:
wherein said conductive material is indium tin oxide.

11. A junction as cited in claim 4:
wherein said conductive material is carbon nanotube.

12. A junction as cited in claim 4:
wherein said conductive material is conducting polymer.

13. A static p-i-n junction, comprising:
a polymer composite;
wherein said polymer composite further comprises mobile anions or cations;
wherein said mobile anions or cations are immobilized on command;
wherein said immobilized anions or cations are locked in position after being immobilized; and
wherein said immobilization is thermally induced.

* * * * *